US012255753B2

(12) United States Patent
Furuta et al.

(10) Patent No.: US 12,255,753 B2
(45) Date of Patent: Mar. 18, 2025

(54) INSULATED COMMUNICATION SYSTEM

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Yoshikazu Furuta, Nisshin (JP); Shigeki Otsuka, Nisshin (JP); Takasuke Ito, Nisshin (JP); Hyoungjun Na, Nisshin (JP); Tomohiro Nezuka, Nisshin (JP)

(73) Assignees: DENSO CORPORATION, Kariya (JP); TOYOTA JIDOSHA KABUSHIKI KAISHA, Toyota (JP); IMRISE Technologies Corporation, Nisshin (JP)

( * ) Notice: Subject to any disclaimer, the term of this patent is extended or adjusted under 35 U.S.C. 154(b) by 0 days.

(21) Appl. No.: 18/187,123

(22) Filed: Mar. 21, 2023

(65) Prior Publication Data

US 2023/0308309 A1  Sep. 28, 2023

(30) Foreign Application Priority Data

Mar. 23, 2022  (JP) .................................. 2022-046881

(51) Int. Cl.
*H04L 12/40* (2006.01)
*G01R 31/396* (2019.01)

(52) U.S. Cl.
CPC ............ *H04L 12/40* (2013.01); *G01R 31/396* (2019.01); *H04L 2012/40215* (2013.01); *H04L 2012/40273* (2013.01)

(58) Field of Classification Search
CPC ............... H04L 12/40; H04L 12/40013; H04L 2012/40215; H04L 2012/40273; G01R 31/3835; G01R 31/396
See application file for complete search history.

(56) References Cited

U.S. PATENT DOCUMENTS

| 6,766,395 B1 | 7/2004 | Tinsley et al. |
| 2006/0170451 A1 | 8/2006 | Jordanger et al. |
| (Continued) | | |

FOREIGN PATENT DOCUMENTS

JP  2018-021879 A  2/2018

OTHER PUBLICATIONS

ISO 11898. "Road vehicles—Controller area network (CAN)—Part 1: Data link layer and physical signalling", 2015.

*Primary Examiner* — Khanh C Tran
(74) *Attorney, Agent, or Firm* — Posz Law Group, PLC

(57) ABSTRACT

An insulated communication system includes a communication controller that sets communication data to a communication symbol through a numeral system and executes insulated communication through an insulator by adopting the communication symbol. The numeral system includes multiple states having a positive state, a negative state and a zero state. The positive state is represented by at least one positive integer, and the negative state is represented by at least one negative integer. The zero state is represented by zero being a level without generating current consumption. An absolute value of the at least one positive integer and an absolute value of the at least one negative integer are identical to each other. The communication controller sets an initial section of the communication data in the communication symbol to the positive state or the negative state, and sets a following section of the communication data to one of the multiple states.

8 Claims, 12 Drawing Sheets

(56) References Cited

U.S. PATENT DOCUMENTS

| | | |
|---|---|---|
| 2015/0108992 A1 | 4/2015 | Kouda et al. |
| 2018/0043789 A1* | 2/2018 | Goetz .................... B60L 58/22 |
| 2020/0099111 A1 | 3/2020 | Numata et al. |
| 2021/0050734 A1* | 2/2021 | Huot-Marchand .......................... H04L 25/4919 |
| 2021/0050736 A1 | 2/2021 | Bordes et al. |
| 2022/0320612 A1 | 10/2022 | Numata et al. |

* cited by examiner

FIG. 3

| BUS STATE | | H | L | M |
|---|---|---|---|---|
| SWITCH STATE | P1 | ON | OFF | OFF |
| | P2 | OFF | ON | OFF |
| | N1 | OFF | ON | OFF |
| | N2 | ON | OFF | OFF |
| COMMUNICATION ANALOG SIGNAL | | | | |

FIG. 4

| REGISTER NAME | VALUE |
|---|---|
| DEMOD_TH1 | 7 |
| DEMOD_TH2 | 6 |

FIG. 6

| COMMUNICATION DATA | COMMUNICATION SYMBOL | | |
|---|---|---|---|
| 000 | −1 | 1 | 0 |
| 001 | −1 | 1 | −1 |
| 010 | 1 | −1 | 0 |
| 011 | 1 | −1 | 1 |
| 100 | −1 | 0 | 1 |
| 101 | −1 | 0 | −1 |
| 110 | 1 | 0 | −1 |
| 111 | 1 | 0 | 1 |

FIG. 7

| COMMUNICATION DATA | COMMUNICATION SYMBOL | | |
|---|---|---|---|
| 00 | −1 | 1 | 0 |
| 01 | 1 | −1 | 0 |
| 10 | −1 | 0 | 1 |
| 11 | 1 | 0 | −1 |

FIG. 8

| COMMUNICATION DATA | COMMUNICATION SYMBOL | | | |
|---|---|---|---|---|
| 0000 | -1 | 1 | 0 | 1 |
| 0001 | -1 | 1 | 0 | -1 |
| 0010 | -1 | 1 | -1 | 1 |
| 0011 | -1 | 1 | -1 | 0 |
| 0100 | 1 | -1 | 0 | 1 |
| 0101 | 1 | -1 | 0 | -1 |
| 0110 | 1 | -1 | 1 | -1 |
| 0111 | 1 | -1 | 1 | 0 |
| 1000 | -1 | 0 | 1 | -1 |
| 1001 | -1 | 0 | 1 | 0 |
| 1010 | -1 | 0 | -1 | 1 |
| 1011 | -1 | 0 | -1 | 0 |
| 1100 | 1 | 0 | -1 | 1 |
| 1101 | 1 | 0 | -1 | 0 |
| 1110 | 1 | 0 | 1 | -1 |
| 1111 | 1 | 0 | 1 | 0 |

A: PRESENT EMBODIMENT
B: COMPARATIVE EXAMPLE

FIG. 11

| COMMUNICATION DATA | COMMUNICATION SYMBOL | | | | |
|---|---|---|---|---|---|
| 000 | −1 | 1 | 0 | 0 | 0 |
| 001 | −1 | 0 | 1 | 0 | 0 |
| 010 | −1 | 0 | 0 | 1 | 0 |
| 011 | −1 | 0 | 0 | 0 | 1 |
| 100 | 1 | −1 | 0 | 0 | 0 |
| 101 | 1 | 0 | −1 | 0 | 0 |
| 110 | 1 | 0 | 0 | −1 | 0 |
| 111 | 1 | 0 | 0 | 0 | −1 |

FIG. 12

| COMMUNICATION DATA | COMMUNICATION SYMBOL | | | | | | | | |
|---|---|---|---|---|---|---|---|---|---|
| 0000 | −1 | 1 | 0 | 0 | 0 | 0 | 0 | 0 | 0 |
| 0001 | −1 | 0 | 1 | 0 | 0 | 0 | 0 | 0 | 0 |
| 0010 | −1 | 0 | 0 | 1 | 0 | 0 | 0 | 0 | 0 |
| 0011 | −1 | 0 | 0 | 0 | 1 | 0 | 0 | 0 | 0 |
| 0100 | −1 | 0 | 0 | 0 | 0 | 1 | 0 | 0 | 0 |
| 0101 | −1 | 0 | 0 | 0 | 0 | 0 | 1 | 0 | 0 |
| 0110 | −1 | 0 | 0 | 0 | 0 | 0 | 0 | 1 | 0 |
| 0111 | −1 | 0 | 0 | 0 | 0 | 0 | 0 | 0 | 1 |
| 1000 | 1 | −1 | 0 | 0 | 0 | 0 | 0 | 0 | 0 |
| 1001 | 1 | 0 | −1 | 0 | 0 | 0 | 0 | 0 | 0 |
| 1010 | 1 | 0 | 0 | −1 | 0 | 0 | 0 | 0 | 0 |
| 1011 | 1 | 0 | 0 | 0 | −1 | 0 | 0 | 0 | 0 |
| 1100 | 1 | 0 | 0 | 0 | 0 | −1 | 0 | 0 | 0 |
| 1101 | 1 | 0 | 0 | 0 | 0 | 0 | −1 | 0 | 0 |
| 1110 | 1 | 0 | 0 | 0 | 0 | 0 | 0 | −1 | 0 |
| 1111 | 1 | 0 | 0 | 0 | 0 | 0 | 0 | 0 | −1 |

FIG. 13

| COMMUNICATION DATA | COMMUNICATION SYMBOL | | | | |
|---|---|---|---|---|---|
| 000 | −1 | 1 | 0 | −1 | 1 |

FIG. 14

| COMMUNICATION DATA | COMMUNICATION SYMBOL | | | | |
|---|---|---|---|---|---|
| 000 | −1 | 1 | 1 | −1 | 0 |

FIG. 15

| COMMUNICATION DATA | COMMUNICATION SYMBOL | | | | | | |
|---|---|---|---|---|---|---|---|
| 000 | 1 | −1 | 1 | 0 | 0 | 0 | −1 |
| 001 | 1 | −1 | 0 | 1 | 0 | 0 | −1 |
| 010 | 1 | −1 | 0 | 0 | 1 | 0 | −1 |
| 011 | 1 | −1 | 0 | 0 | 0 | 1 | −1 |
| 100 | −1 | 1 | −1 | 0 | 0 | 0 | 1 |
| 101 | −1 | 1 | 0 | −1 | 0 | 0 | 1 |
| 110 | −1 | 1 | 0 | 0 | −1 | 0 | 1 |
| 111 | −1 | 1 | 0 | 0 | 0 | −1 | 1 |

FIG. 16

| COMMUNI-CATION DATA | COMMUNICATION SYMBOL | | | | | | | | | | |
|---|---|---|---|---|---|---|---|---|---|---|---|
| 0000 | 1 | −1 | 1 | 0 | 0 | 0 | 0 | 0 | 0 | 0 | −1 |
| 0001 | 1 | −1 | 0 | 1 | 0 | 0 | 0 | 0 | 0 | 0 | −1 |
| 0010 | 1 | −1 | 0 | 0 | 1 | 0 | 0 | 0 | 0 | 0 | −1 |
| 0011 | 1 | −1 | 0 | 0 | 0 | 1 | 0 | 0 | 0 | 0 | −1 |
| 0100 | 1 | −1 | 0 | 0 | 0 | 0 | 1 | 0 | 0 | 0 | −1 |
| 0101 | 1 | −1 | 0 | 0 | 0 | 0 | 0 | 1 | 0 | 0 | −1 |
| 0110 | 1 | −1 | 0 | 0 | 0 | 0 | 0 | 0 | 1 | 0 | −1 |
| 0111 | 1 | −1 | 0 | 0 | 0 | 0 | 0 | 0 | 0 | 1 | −1 |
| 1000 | −1 | 1 | −1 | 0 | 0 | 0 | 0 | 0 | 0 | 0 | 1 |
| 1001 | −1 | 1 | 0 | −1 | 0 | 0 | 0 | 0 | 0 | 0 | 1 |
| 1010 | −1 | 1 | 0 | 0 | −1 | 0 | 0 | 0 | 0 | 0 | 1 |
| 1011 | −1 | 1 | 0 | 0 | 0 | −1 | 0 | 0 | 0 | 0 | 1 |
| 1100 | −1 | 1 | 0 | 0 | 0 | 0 | −1 | 0 | 0 | 0 | 1 |
| 1101 | −1 | 1 | 0 | 0 | 0 | 0 | 0 | −1 | 0 | 0 | 1 |
| 1110 | −1 | 1 | 0 | 0 | 0 | 0 | 0 | 0 | −1 | 0 | 1 |
| 1111 | −1 | 1 | 0 | 0 | 0 | 0 | 0 | 0 | 0 | −1 | 1 |

FIG. 17

| COMMUNICATION DATA | COMMUNICATION SYMBOL | | | | | | |
|---|---|---|---|---|---|---|---|
| 001 | 1 | −1 | 1 | 0 | −1 | 1 | −1 |

FIG. 18

| COMMUNICATION DATA | COMMUNICATION SYMBOL | | | | | | |
|---|---|---|---|---|---|---|---|
| 001 | 1 | −1 | 1 | 0 | −1 | 0 | 0 |

100# INSULATED COMMUNICATION SYSTEM

CROSS REFERENCE TO RELATED APPLICATION

This application is based on Japanese Patent Application No. 2022-046881 filed on Mar. 23, 2022, the disclosure of which is incorporated herein by reference.

TECHNICAL FIELD

The present disclosure relates to an insulated communication system.

BACKGROUND

Controller Area Network (CAN) may be adopted as an in-vehicle insulated communication system. CAN is a communication standard for mutual communication between an ECU and other devices as defined in ISO11898, and a communication circuit may adopt a circuit conforming the communication standard of CAN.

SUMMARY

The present disclosure describes an insulated communication system that includes a communication controller for executing insulated communication.

BRIEF DESCRIPTION OF DRAWINGS

FIG. 3 illustrates correspondence between a switch state and a level of a communication line when the transmission circuit transmits a data signal.

FIG. 4 illustrates an example of setting values stored in a storage.

FIG. 6 illustrates an example of setting a state of communication data in a communication symbol during communication of 3-bit data.

FIG. 7 illustrates an example of setting a state of communication data in a communication symbol during communication of 2-bit data.

FIG. 8 illustrates an example of setting a state of communication data in a communication symbol during communication of 4-bit data.

FIG. 11 illustrates an example of setting a state of communication data in a communication symbol during communication of 3-bit data in a second embodiment.

FIG. 12 illustrates an example of setting a state of communication data in a communication symbol during communication of 4-bit data.

FIG. 13 illustrates an example of setting a state of communication data in a communication symbol during communication of 3-bit data according to a first modification of modification of the second embodiment.

FIG. 14 illustrates an example of setting a state of communication data in a communication symbol during communication of 3-bit data according to a second modification of the second embodiment.

FIG. 15 illustrates an example of setting a state of communication data in a communication symbol during communication of 3-bit data in a third embodiment.

FIG. 16 illustrates an example of setting a state of communication data in a communication symbol during communication of 4-bit data.

FIG. 17 illustrates an example of setting a state of communication data in a communication symbol during communication of 3-bit data according to a first modification of the third embodiment.

FIG. 18 illustrates an example of setting a state of communication data in a communication symbol during communication of 3-bit data in a second modification of the third embodiment.

DETAILED DESCRIPTION

Figure 1:
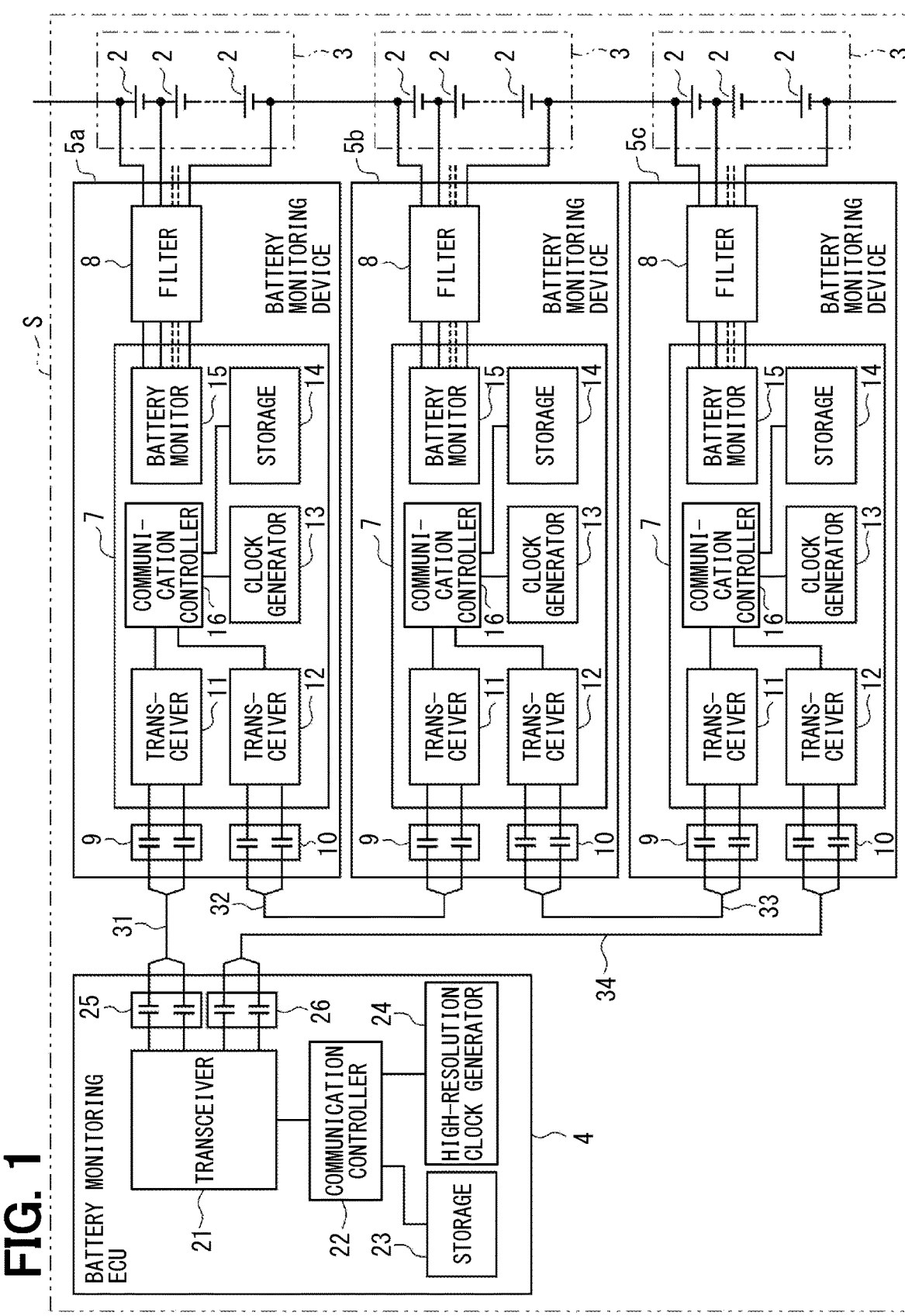
FIG. 1 illustrates an electrical structure of a battery monitoring system according to a first embodiment.

It may be anticipated that the data rate increases in accordance with a demand for enhancing an in-vehicle communication speed in the CAN. Therefore, current consumption per unit of time may increase if one-bit communication cycle is shortened. In other words, the current consumption may be enlarged by an increase in the data rate. Manchester coding may be adopted in the insulated communication system. The Manchester coding may also be referred to as a binary phase modulation as the encoding method in which binary states "1" and "0" of the transmission data are respectively allocated to the transition from a negative state "−1" to a positive state "+1" and the transition from the positive state "+1" to the negative state "−1". For this reason, in the Manchester coding, it may be required to transmit a 2-bit signal per 1 bit of transmission data. Although the power efficiency may be low in the Manchester coding, the Manchester coding may be suitable for insulated communication through which a DC component of a signal cannot be transmitted since the signal in the Manchester coding does not have a DC component. In the Manchester coding, the timing of state transition matches a symbol rate, and it is possible to transmit an embedded clock signal and enable clock synchronization at a reception side.

A communication circuit may largely consume power during data transmission. Therefore, it may be effective to perform data transmission with a short pulse for decreasing power consumption in communication. The following example may be adopted for increasing the number of transmission bits per symbol as a unit of transmission, without largely increasing the current consumption. When the data is not transmitted, a zero state "0" as valid communication data normally has no meaning. However, in some occasions, the coding may also include the zero state "0".

Since the communication circuit does not consume a signal power in the zero state "0", the power consumption per transmitting symbol may be decreased at the transmission side. An encoding system such as the Manchester coding may be adopted to shorten a driving period in the positive state "+1" and the negative state "−1". By lengthening a period of the zero state "0", it is possible to shorten the driving period per unit time. Therefore, it is possible to decrease power consumption.

The power consumption may further be decreased by transmitting data with a shorter pulse. However, this technique may not be adopted since all communication information is held between symbols. Even though the symbols are transmitted in bursts and a period during which the transmission data is not transmitted between the symbols is provided, since the encoding allows the zero state "0" in an initial bit of the symbol, it may be difficult to determine the initial bit of the communication symbol at the reception side as it may be required to provide an additional section for detecting the timing of the zero state "0" at the reception side.

According to an aspect of the present disclosure, an insulated communication system includes a communication controller that sets communication data to a communication symbol through a numeral system being a ternary system or higher and executes insulated communication through an insulator by adopting the communication symbol. The numeral system includes multiple states having a positive state, a negative state and a zero state. The positive state is represented by at least one positive integer. The negative state is represented by at least one negative integer. The zero state is represented by zero. The zero state has a level without generating current consumption and is between the positive state and the negative state. An absolute value of at least one positive integer included in the positive state and an absolute value of at least one negative integer included in the negative state are identical to each other. The communication controller sets an initial section of the communication data in the communication symbol to the positive state or the negative state, and sets a following section of the communication data following the initial section of the communication data to one of the multiple states.

According to the above structure, the initial section of the communication data of the communication symbol is set to either the positive state or the negative state, it is possible to determine an initial bit of the communication symbol at the reception side. In addition, the following section of the communication data having combination of three or more values included in the communication symbol is not particularly limited. Therefore, it is possible to restrict current consumption per communication symbol in a single modulation while determining the initial bit of the communication symbol at the reception side.

The following describes several embodiments related to an insulated communication system with reference to the drawings. Identical reference signs designate identical parts throughout several embodiments described below to omit redundant description.

First Embodiment

The following describes a first embodiment related to a battery monitoring system S with reference to FIGS. 1 to 9. As illustrated in FIG. 1, an assembled battery 1 includes assembled battery units 3 connected in series. In each of the assembled battery units 3, multiple battery cells 2 are further connected in series. The battery cell 2 is, for example, a secondary battery such as a lithium ion battery. The battery monitoring system S connected to the assembled battery 1 forms an insulated communication system by connecting a battery monitoring ECU 4 as a main node and battery monitoring devices 5a, 5b, 5c as slave nodes. The assembled battery 1 may also be referred to as a battery pack.

The battery monitoring ECU 4 includes a transceiver 21, a communication controller 22, a storage 23 and a high-resolution clock generator 24. The transceiver 21 is an insulated communication device for performing insulated communication between the battery monitoring devices 5a and 5c through insulators 25, 26. The battery monitoring ECU 4 receives and transmits a communication symbol having communication data through the transceiver 21 among the battery monitoring devices 5a, 5b, 5c. The battery monitoring ECU 4 operates based on a clock signal generated by the clock generator 24, and operates through execution of a program stored in the storage 23. The clock generator 24 adopts, for example, a crystal oscillator, and can generate a clock signal having a higher resolution than the clock generator 13 adopted at the battery monitoring devices 5a, 5b, 5c. A silicon MEMS oscillator may be adopted in replacement of the crystal oscillator. A clock signal may be generated by receiving a GNSS reference frequency from a GNSS satellite.

Each of the battery monitoring devices 5a, 5b, 5c measures a voltage across corresponding terminals of the battery cells 2 connected in series. The number of the battery cells 2 monitored by each of the battery monitoring devices 5a, 5b, 5c is identical. However, the number of the battery cells monitored by each of the battery monitoring devices 5a, 5b, 5c may be different. The battery cells 2 respectively monitored by the battery monitoring devices 5a, 5b, 5c may be monitored in an overlapping manner.

Since the battery monitoring devices 5a, 5b, 5c are provided with identical configuration elements, the identical reference numerals are appended to the identical configuration elements. Each of the battery monitoring devices 5a, 5b, 5c includes a battery monitoring integrated circuit (IC) 7, a filter 8 and insulators 9, 10. The battery monitoring IC 7 monitors whether or not a fault is present in the battery cell 2.

The battery monitoring IC 7 includes two transceivers 11, 12, a clock generator 13, a storage 14, a battery monitor 15, and a communication controller 16. The filter 8 outputs the filtered voltage to the battery monitoring IC 7 when the voltage of the battery cell 2 is received. The battery monitor 15 performs A/D conversion of the filtered voltage. Each of the battery monitoring devices 5a, 5b, 5c operates based on a clock signal generated by the clock generator 13, and operates based on the execution of the program stored in the storage 14.

The clock generator 13 includes an RC oscillator or a ring oscillator, and can only generate a clock signal with lower accuracy than the clock generator 24 of the above-mentioned battery monitoring ECU 4. However, the clock generator 13 can modify the variable capacitance by, for example, adopting a variable capacitance for the capacitor included in the oscillator, and can easily modify the oscillation frequency by varying a biased current. The battery monitoring IC 7 included in each of the battery monitoring devices 5a, 5b, 5c acquires the voltage of the corresponding battery cells 2 through the battery monitor 15 via the filter 8. The battery monitor 15 can also detect the state of the battery cell 2 through an alternating current (AC) impedance method by adopting a reference signal based on the output signal of the clock generator 13.

A communication line 31 is connected between an insulator 25 of the battery monitoring ECU 4 and the insulator 9 of the battery monitoring device 5a. A communication line 32 is connected between the insulator 10 of the battery monitoring device 5a and the insulator 9 of the battery monitoring device 5b. A communication line 33 is connected between the insulator 10 of the battery monitoring device 5b and the insulator 9 of the battery monitoring device 5c. A communication line 34 is connected between the insulator 10 of the battery monitoring device 5c and an insulator 26 of the battery monitoring device 5c. In other words, the communication lines 31 to 34 are connected in a ring among the battery monitoring ECU 4 and the corresponding battery monitoring devices 5a to 5c. The battery monitoring ECU 4 and the battery monitoring devices 5a, 5b, 5c perform insulated communication by differential signals using communication paths insulated by the insulators 9, 10, 25, 26. Each of the insulators 9, 10, 25, 26 includes, for example, a capacitor as an insulating element or a transformer and a filter.

The communication controller 16 of each of the battery monitoring devices 5a, 5b, 5c receives a correction instruction of the clock signal of the clock generator 13 from the battery monitoring ECU 4, the communication controller 16 corrects the frequency of the clock signal of the clock generator 13 by using the insulated communication to make the frequency closer to the frequency of the high-resolution clock signal of the battery monitoring ECU 4.

The transceivers 11, 12 of each of the battery monitoring devices 5a, 5b, 5c are connected to the communication controller 16. The communication controller 16 can perform communication between adjacent battery monitoring ECUs 4 through the transceivers 11, 12 or communication between the transceivers 11, 12 of adjacent battery monitoring devices.

For example, two transceivers 11, 12 of the battery monitoring device 5a are connected between the transceiver 21 of the battery monitoring ECU 4 and the transceiver 11 of the battery monitoring device 5b. Two transceivers 11, 12 of the battery monitoring device 5b are connected between the transceiver 12 of the battery monitoring device 5a and the transceiver 11 of the battery monitoring device 5c. For example, two transceivers 11, 12 of the battery monitoring device 5c are connected between the transceiver 12 of the battery monitoring device 5b and the transceiver 21 of the battery monitoring ECU 4.

The battery monitoring ECU 4 transmits a command value of the battery monitoring ECU 4 to the battery monitoring devices 5a, 5b, 5c through communication in a master-slave manner. At this time, since the circuit included in each of the battery monitoring devices 5a, 5b, 5c acquires a ground voltage as a reference from the battery cell 2 to be monitored, a transmission terminal and a reception terminal of each of the transceivers 11, 12 are insulated by each of the insulators 9, 10. The battery monitoring ECU 4 and the battery monitoring devices 5a, 5b, 5c perform communication through differential signals to ensure an S/N ratio and reduce consumption current even if shortening a communication cycle.

The following describes the encoding method of encoding communication symbols as an example. Communication data has a value represented by one of three or more integers including a zero state "0", a positive state "1" and a negative state "−1". In the zero state "0", there is no current consumption. The voltage level in the positive state "1" is higher than the zero state "0". The voltage level in the negative state "−1" is lower than the zero state "0". The battery monitoring ECU 4 and the battery monitoring devices 5a, 5b, 5c perform insulated communication through the insulators 25, 26, 9, 10 by a communication symbol integrating the communication data.

In the present embodiment, as the feature of encoding, the average value of transmission voltage values per symbol, in other words, the DC component is 0 for facilitating insulated communication. The above describes the states represented by integers such that "1" is represented as the positive state and the "0" is represented as the negative state. However, "2" may be represented as the positive state and "−2" may be represented by the negative state such that the absolute values of the both states are identical, so that the average value of the DC component is 0.

Figure 2:
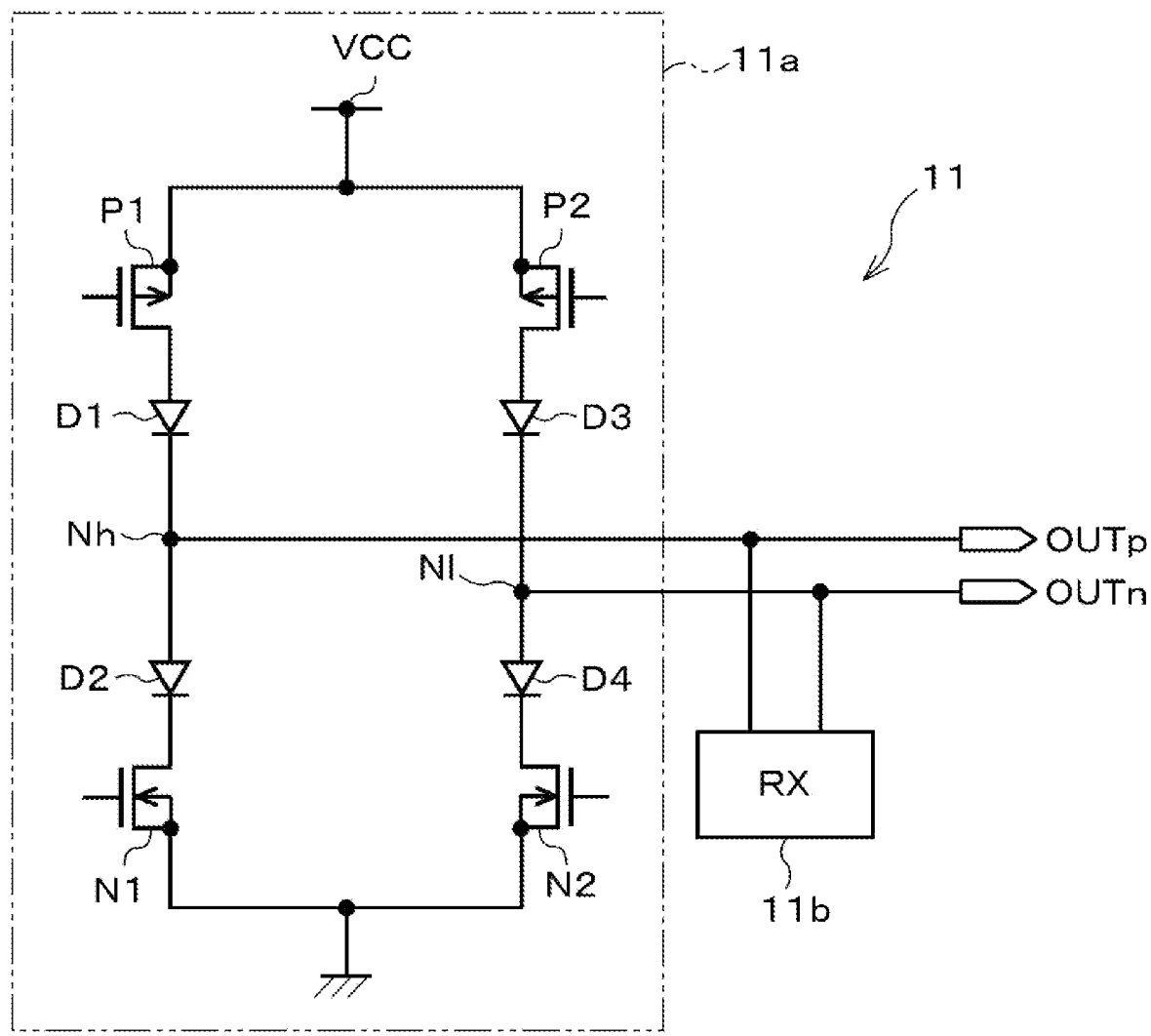
FIG. 2 illustrates an electrical structure of a transmission circuit.

Since the structure of each of the transceivers 21, 11, 12 is identical, the following only describes the structure of the transceiver 11. FIG. 2 illustrates the structure of a transmission circuit 11a of the transceiver 11. As illustrated in FIG. 2, the transmission circuit 11a includes an H-bridge circuit formed by connecting a P-channel metal-oxide-semiconductor field-effect transistor (MOSFET) P1, diodes D1, D2, and an N-channel MOSFET N1 between an application node of the power supply voltage VCC and a ground node, and connecting a P-channel MOSFET P2, diodes D3, D4, and an N-channel MOSFET N2 between the application node of the power supply voltage VCC and the ground node. The transmission circuit 11a outputs the voltage between the common connection node of the diodes D1, D2 and the common connection node of the diodes D3, D4 as the communication data to the communication line 31.

As illustrated in FIG. 3, the transmission circuit 11a turns on the MOSFETs P1, N2 and turns off the MOSFETs P2, N1. Then, the potential at the common connection node Nh can be made higher than the potential at the common connection node Nl to perform output to the communication line 31. In the following, the bus state of the communication line 31 at this time is referred to as the positive state "+1".

When the transmission circuit 11a outputs the negative state "−1", the transmission circuit 11a turns on the MOSFETs P2, N1 and turns off the MOSFETs P1, N2. Then, it is possible to perform output to the communication line 31 by increasing the potential of the common connection node Nl to be higher than the potential at the common connection node Nh. In the following, the bus state of the communication line 31 at this time is referred to as the negative state "−1".

When the transmission circuit 11a outputs the zero state "0", the transmission circuit 11a holds the common connection nodes Nh, Nl at an opened state by turning off the MOSFETs P1, P2, N1, N2. At this time, the reception circuit of the other party is connected to the communication line 31, and the biased potential preliminarily set to the intermediate value between the power supply voltage VCC and the ground. Thus, it is possible to output the zero state "0". At this time, since the transmission circuit 11a turns off the MOSFETs P1, P2, N1, N2, there is no current consumption.

A metal-oxide-semiconductor field effect transistor (MOSFET) for switching may be connected between a pair of communication lines 31. Alternatively, the MOSFET for switching may be connected between a pair of the communication lines 31 through a diode. At this time, when the corresponding MOSFET is turned on, it is possible to set the potential between a pair of the communication lines 31 to a common potential so that the zero state "0" can be output to the communication line 31.

The reception circuit of the other party, for example, the transceiver 21 of the battery monitoring ECU 4 compares the potential of the communication line 31 with a predetermined high threshold Vth and a predetermined low threshold Vtl. If the potential is higher than the high threshold Vth, the transceiver 21 of the battery monitoring ECU 4 receives a digital signal of a positive pulse P as the positive state "1". If the potential is lower than the low threshold Vtl, the transceiver 21 of the battery monitoring ECU 4 receives a digital signal of a negative pulse N as the negative state "−1".

During the reception of the positive state "1" and the negative state "−1" at the transceiver 21, if a value is smaller than or equal to a high threshold value Vth and larger than or equal to a low threshold value Vtl in a sampling timing, this value is accepted as the zero state "0" in the sampling timing. If the differential voltage of the communication line 31 is maintained at the zero state "0", there is no consumption current in principle. Thus, it is possible to enhance the data rate without raising the current consumption.

Figure 5:
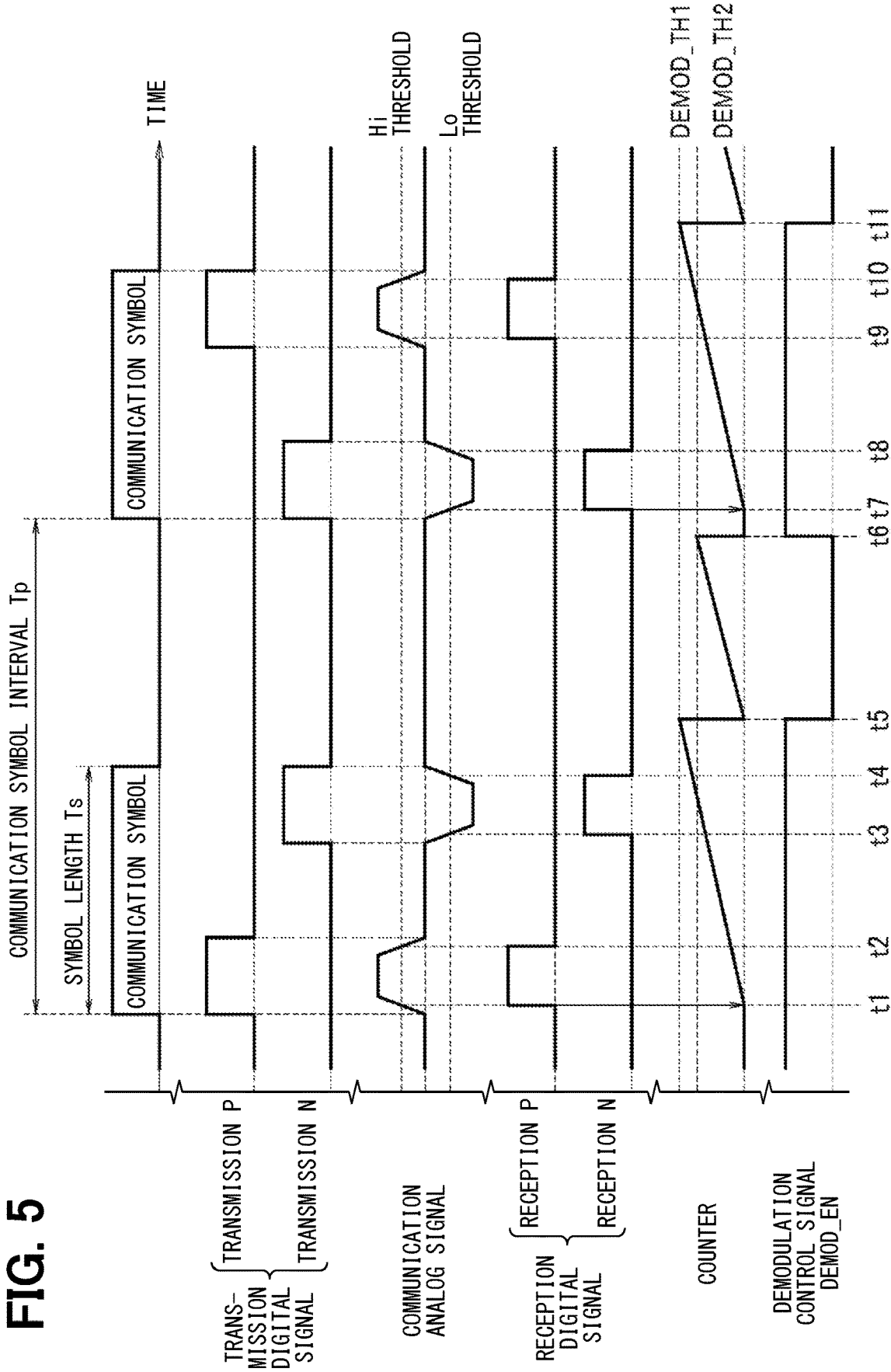
FIG. 5 illustrates a time chart.

The following describes the encoding method of communication data and the transmission/reception method with reference to FIGS. 4, 5. The insulated communication executes communication by adopting a communication symbol having ternary data with the negative state "−1", the positive state "1" and the zero state "0".

The communication lines 31 to 34 are connected among the battery monitoring devices 5a, 5b, 5c, or among the battery monitoring ECU 4 and the battery monitoring devices 5a, 5b, 5c. However, the communication lines 31 to 34 are maintained at a potential identical to the zero state during normal standby right after the activation of the power supply. Therefore, the battery monitoring ECU 4 or the battery monitoring devices 5a, 5b, 5c do not start from the zero state at the time of transmitting the communication data. The initial state of the communication symbol is set to the negative state "−1" or the positive state "+1". If the initial state is set to the zero state "0", the reception side of the other party cannot recognize the communication data in the zero state "0".

In a case where the battery monitoring ECU 4 or the battery monitoring devices 5a, 5b, 5c execute the insulated communication, the communication controller 22 or 16 initially reads out information required for communication control such as communication format from the storage 23 or 14. Since the information stored in the storages 23, 14 is generally identical, the following describes the information stored in the storage 14 and omits the description of the information stored in the storage 23.

The storage 14 of the battery monitoring IC 7 stores a communication symbol length Ts for communication in a single modulation. The single modulation may also be referred to as a one-time modulation. As illustrated in FIG. 4, the storage 14 stores a value DEMOD_TH1 and a value DEMOD_TH2. The value DEMOD_TH1 is preliminarily set based on the symbol length Ts (=t4−t1) or the communication symbol length Ts, and the value DEMOD_TH2 is preliminarily set based on Tp−Ts. Tp denotes the communication symbol interval (=t6−t1). Ts denotes the communication symbol length. The value DEMOD_TH1 is preliminarily determined in accordance with the time for transmitting one communication symbol, and indicates a threshold value of the count time for counting a time longer than the communication symbol length Ts shown in FIG. 5 by a margin time (=t5−t4). The value DEMOD_TH2 is preliminarily determined in accordance with the time from receiving one symbol to receiving subsequent one symbol, and indicates a threshold value of a count time for counting the time corresponding to Tp−(Ts+margin time) as shown in FIG. 5.

The following describes the transmission of the communication symbol from the battery monitoring ECU 4 to the battery monitoring device 5a. The communication controller 22 of the battery monitoring ECU 4 generates the transmission data including a command and data. At this time, the communication controller 22 executes modulation of the transmission data having any value of a ternary system including the negative state "−1", the positive state "1" and the zero state "0" to the communication symbol with a predetermined bit. In the present embodiment, one communication symbol includes 3-bit communication data. At this time, initial communication data of the communication symbol is set to the negative state "−1" or the positive state "1" so that the leading end of the communication data at the reception side can be determined. The transceiver 21 converts a series of the communication data to a communication analog signal, and then transmits the converted communication analog signal through the insulator 25 and the communication line 31. At this time, the symbol length Ts as the length of one transmitted symbol is shorter than the communication symbol interval Tp as an interval between communication symbols.

In the battery monitoring device 5a at the reception side, the transceivers 11, 12 have been in a reception standby state from the activation of the power supply, and a demodulation control signal DEMOD_EN waits in a demodulation effective state. The demodulation control signal DEMOD_EN controls whether or not to demodulate the received communication signal. The communication controller 16 of the battery monitoring IC 7 in the battery monitoring device 5a executes a process of reading out the communication symbol length Ts from the storage 14 after turning on the power supply. The communication controller 16 reads out the value DEMOD_TH1 and the value DEMOD_TH2 preliminarily stored in the storage 14 after turning on the power supply in accordance with the communication symbol length Ts and then be in an idle state.

When the transceiver 21 of the battery monitoring ECU 4 transmits the communication analog signal in the timing t1 of FIG. 5, the transceiver 11 of the battery monitoring IC 7 compares the received analog signal through a first comparator and a second comparator and then convert the analog signal to a reception digital signal. The first comparator compares the received analog signal with a high threshold value Vth, and the second comparator compares the received analog signal with a low threshold value Vt1.

The communication controller 16 of the battery monitoring IC 7 has a built-in counter. The communication controller 16 receives the communication symbol from the timing at which the communication data of the communication symbol is initially received to the timing of counting the predetermined number based on the length of the communication symbol stored in the storage 14.

When the transceiver 11 detects an initial signal of the communication symbol, the communication controller 16 of the battery monitoring IC 7 starts a count-up operation from the timing t1 at which the initial communication data is received. The counter sequentially counts up based on the clock generated by the clock generator 13. Since the demodulation control signal DEMOD_EN is active "H", the reception digital signal is modulated at each predetermined timing.

The communication controller 16 receives the communication data through the transceivers 11, 12 and demodulates the communication data until the counter reaches the register value DEMOD_TH1, in other words, during a period in which the demodulation signal DEMOD_EN is active "H". During the period in which the demodulation control signal DEMOD_EN is active, the communication controller 16 determines whether the state of the received communication data is in the positive state "1", the negative state "−1" or the zero state "0".

In the present embodiment, the communication data having the communication symbol is predetermined to have 3 bits. Therefore, 3-bit sampling time can be defined though the counter value based on the value DEMOD_TH1, 3-bit information and the counter value, and it is possible to determine whether the state is in the positive state "1", the negative state "−1" or the zero state "0" at the defined sampling time. Since no power is consumed in the zero state "0", both of communication speed and power consumption can be achieved, communication resistant to noise superimposed on the communication lines 31 to 34 can also be achieved.

When the counter reaches the register value DEMOD_TH1 in the timing t5, the communication controller 16 sets the demodulation control signal to the demodulation ineffective state "L" and resets the counter value to continue counting.

Subsequently, when the counter reaches the register value DEMOD_TH2, the demodulation control signal is changed to the demodulation effective state "H". While the demodulation control signal is in the state "L", the communication controller 16 does not operate the demodulation. In the period from t5 to t6 during which the demodulation control signal is in the state "L", even though the transceivers 11, 12 have an erroneous operation caused by noise, it is possible to maintain an adequate communication state without operating the demodulation. After that, it is possible to execute the communication of communication symbols as shown from t6 to t11 in FIG. 5. Therefore, it is possible to repeat the communication of the communication symbols every communication symbol interval Tp.

The clock of the built-in clock generator 13 is counted by using another counter inside the communication controller 16, an error in the oscillation frequency of the clock generator 13 can be estimated and the clock frequency of the clock generator 13 can be corrected.

FIG. 6 illustrates the encoding method in a case where the communication data included in one communication symbol has 3 bits. When the 3-bit communication data is encoded, as illustrated in FIG. 6, the communication data may be specified as one of eight types including "−1,1,0", "−1,1,−1", "1,−1,0", "1,−1,1", "−1,0,1", "−1,0,−1", "1,0,−1", and "1,0,1" in chronological order. Then, the 3-bit communication data may be expressed by three unit times. "−1" indicates the negative state. "1" indicates the positive states. "0" indicates the zero state.

FIG. 7 illustrates the encoding method in a case where the communication data included in one communication symbol has 2 bits. When the 2-bit communication data is encoded, as illustrated in FIG. 7, the communication data may be specified as one of four types including "−1,1,0", "1,−1,0", "−1,0,1", and "1,0,−1" in chronological order. Then, the 2-bit communication data may be expressed by three unit times.

FIG. 8 illustrates the encoding method in a case where the communication data included in one communication symbol has 4 bits. As illustrated in FIG. 8, when 4-bit data is encoded, the communication data may be specified as one of sixteen types including "−1,1,0,1", "−1,1,0,−1", "−1,1,−1,1", "−1,1,−1,−1", "1,−1,0,1", "1,−1,0,−1", "1,−1,1,−1", "1,−1,1,0", "−1,0,1,−1", "−1,0,1,0", "−1,0,−1,1", "−1,0,−1,0", "1,0,−1,1", "1,0,−1,0", "1,0,1,−1", and "1,0,1,0" in chorological order. Then, the 4-bit communication data may be expressed by four unit times.

That is, in the structure of multi-bit data, the multi-bit data is initially set by negative state "−1" or positive state "1", and then it may be set so that it can take any of the three states of the zero state "0" in addition to negative state "−1" and positive state "1". In other words, according to the rule of communication data, the positive state "1" is followed by the negative state "−1" or the zero state "0", or the negative state "−1" is followed by the positive state "1" or the zero state "0", or the zero state "0" is followed by the positive state "1" or the negative state "−1". As a result, the number of bits can be increased from two to four.

Comparative Result with Comparative Example

When the communication data is transmitted by adopting only the positive state "1" and the negative state "−1", the number of switching times of the switching element is changed according to an increase in the number of times of the positive state "1" and the negative state "−1". As illustrated in the characteristics B of a comparative example in FIG. 9, the consumption current is proportional to the data rate.

In an example of setting the communication data as shown in FIGS. 6 to 8, the data rate at which 1 bit can be transmitted with the range shown in FIGS. 6 to 8 is set to 1 as a reference value. Then, the data rate relative value can be expressed as (2-bit data):(3-bit data):(4-bit data)=4:6:8 as shown in characteristic A of the present embodiment in FIG. 9.

Figure 9:
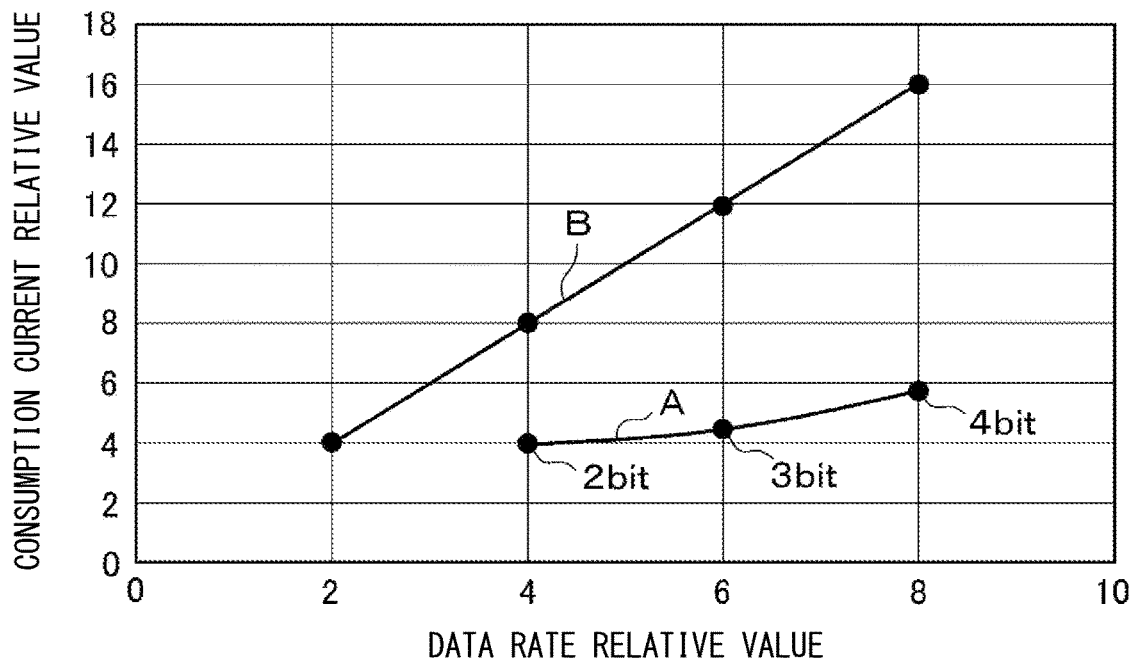
FIG. 9 illustrates an advantageous effect in the first embodiment as compared with a comparative example.

As described with reference to FIGS. 6 to 8, it is possible to inhibit an increase in a change of the number of times of the positive state "1" and the negative state "−1" by executing the communication of the communication data including the zero state "0". When the positive state "1" or negative state "−1" is changed to the zero state "0" or when the zero state "0" is changed to the positive state "1" or the negative state "−1", the level of change from the positive state "1" to the negative state "−1" becomes smaller. Therefore, it is possible to decrease the switching loss and further inhibit the power consumption. Even though the data rate is increased, the power consumption can be reduced without increasing the power consumption. In the present embodiment, the power consumption relative value of (2-bit data):(3-bit data):(4-bit data) is 4:4.5:8 as shown in characteristic A of the present embodiment as illustrated in FIG. 9.

According to the present embodiment, in the structure of multi-bit data, the multi-bit data is initially set by negative state "−1" or positive state "1", and then it may be set so that it can take any of the three states. The above setting eliminates the upper limit on the number of pieces of multi-bit data theoretically, and it is possible to increase the number of pieces. As a result, it is possible to inhibit the current consumption per communication symbol that is communicated at a single modulation while determining the initial bit of the communication symbol at the reception side. FIGS. 6 to 8 merely illustrate an example of the combination of communication symbols. Other combinations may also be possible.

Second Embodiment

Figure 10:
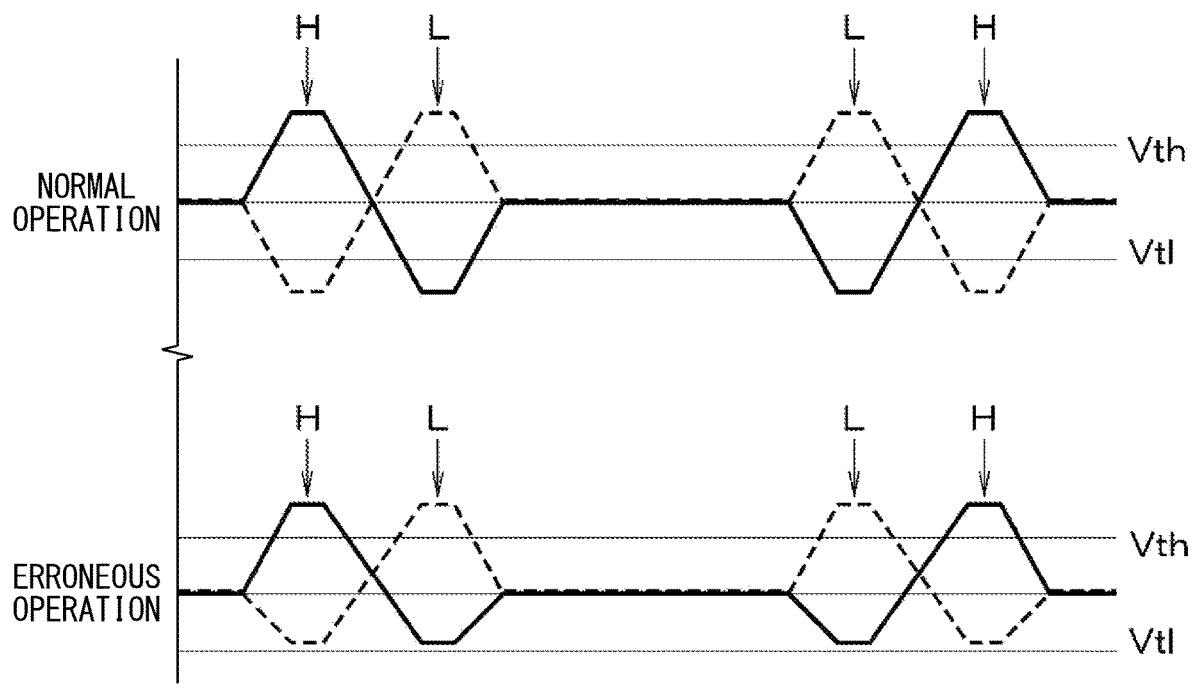
FIG. 10 illustrates an erroneous operation.

The following describes a second embodiment with reference to FIGS. 10 and 11. For example, when the communication encoding method described in the first embodiment is applied, when the number of bits represented by either the positive state "1" or the negative state "−1" is increased in one communication symbol interval Tp, the ratio of the zero state "0" without generating the consumption current is decreased. Thus, the advantageous effect of the low power consumption is not remarkable. In contrast, it is possible to achieve lower power consumption by increasing the number of the zero state "0" included in the communication data per communication symbol interval Tp.

In a normal operation, when a communication analog signal communicating through the communication lines 31 to 34 reaches the low threshold value Vt1 or the high threshold value Vth, the reception side can recognize the data with the positive state "1" or the negative state "−1". Since the benefit of low power consumption is optimized, the duration of the zero state "0" increases when the number of the zero state "0" significantly increases. As a result, an erroneous operation may occur as the voltage during standby drops. At this time, if the number of the negative state "−1" and the number of the positive state "1" are not balanced, the voltage during standby deviate greatly from a standard value of the zero state "0", and the communication signal does not reach the low threshold value Vt1 when the deviation is beyond a certain range. Thus, the erroneous operation may occur. As the erroneous operation is illustrated in FIG. 10, when the transmission side transmits continuous communication data with the positive state "1" and the negative state "−1", the communication data does not reach the threshold side of both of the high threshold value Vth and the low threshold value Vt1 and causes the erroneous operation. For example, FIG. 10 illustrates that the communication data does not reach the low threshold value Vt1.

When the communication data has the positive state "1", the zero state "0" and the negative state "−1", it may be desirable to use the same number for the positive state "1" and the negative state "−1", and the sum of the value representing the positive state "1" of the communication data and the value representing the negative state "−1" of the communication data in the communication symbol at a single modulation.

In particular, in the combination of the negative state "−1", the positive state "1", and the zero state "0", the negative state "−1" and the positive state "1" may be set once per communication symbol interval Tp, and the number of the zero state "0" may be set twice.

FIG. 11 illustrates the encoding method in a case where the communication data included in one communication symbol has 3 bits. When the negative state "−1" and the positive state "1" are respectively set once for the 3-bit communication data, as illustrated in FIG. 11, the negative state "−1" may be set for the initial bit, and the position of the positive state "1", which is subsequently set, may be shifted for each communication data. Alternatively, the positive state "1" may be set for the initial bit, and the negative state "−1", which is set subsequently, may be shifted for each communication data. Then, all 3-bit communication data may be expressed by five unit times.

FIG. 12 illustrates the encoding method in a case where the communication data included in one communication symbol has 4 bits. When the negative state "−1" and the positive state "1" are respectively set once for the 4-bit communication data, as illustrated in FIG. 12, the negative state "−1" may be set for the initial bit, and the position of the positive state "1", which is subsequently set, may be shifted for each communication data. Alternatively, the positive state "1" may be set for the initial bit, and the negative state "−1", which is set subsequently, may be shifted for each communication data. Then, all 4-bit communication data may be expressed by nine unit times.

Each of FIGS. 13 and 14 illustrates modification of the present embodiment. FIGS. 13 and 14 illustrate a situation in which the communication data is "000", and omit other combinations. As long as the number of the positive state "1" and the number of the negative state "−1" are identical, the positive state "1" may be set twice and the negative state "−1" may be set twice. The communication data at the beginning of the communication symbol is required to be set to the negative state "−1" or the positive state "1"; however, the position of the zero state "0" may be set at any position other than the beginning position. As illustrated in FIG. 14, the zero state "0" may be set at the final bit of the communication symbol.

In the present embodiment, each communication data is communicated per communication symbol interval Tp. Since the number of the positive state "1" and the number of the negative state "−1" are identical, it is possible to inhibit the consumption current as compared with the first embodiment. Additionally, it is possible to further reduce the consumption current at the time of transmitting each communication data to an ideal value. In particular, in a case where the negative state "−1" and the positive state "1" are set only once and the number of the zero state "0" is larger than 1, it is possible to achieve maximum reduction in the consumption current by increasing the number of zero state "0".

Third Embodiment

The following describes a third embodiment with reference to FIGS. 15 to 18. The zero state "0" has a longer duration when the communication data per communication symbol interval Tp has more bits. When the duration of the zero state "0" between the positive state "1" and the negative state "−1" is set to be longer, the reception side will not be able to synchronize clock signals defining the sampling timing and may not be able to execute communication normally.

It may be desirable that the initial two bits of communication data in the communication symbol adopts the data structure with the Manchester code. The Manchester coding may also be referred to as a binary phase modulation as the encoding method in which binary states "1" and "0" of the transmission data are respectively allocated for the transition from a negative state "−1" to a positive state "+1" and the transition from the positive state "+1" to the negative state "−1".

FIG. 15 illustrates that 3-bit communication data is set as the communication symbol. FIG. 16 illustrates that 4-bit communication data is set as the communication symbol. The initial two bits of the communication data surrounded by a thick frame in each of FIGS. 15 and 16 are set to the positive state "1" and the negative state "−1" or the negative state "−1" and the positive state "1". These initial two bits are encoded by the Manchester coding. At this time, the timing of the state transition of the initial two bits matches the symbol rate, and the signal having an embedded clock with a period equal to the state transition of the initial two bits can be transmitted.

In FIG. 15, the transmission side assigns, for example, the initial two bits to the positive state "1" and the negative state "−1" and transmits the communication signal. With regard to the third bit or the latter bits in each of FIGS. 15 and 16, a normal transmission digital signal as illustrated in FIG. 5 with the positive state "1", the negative state "−1" and the zero state "0" is transmitted. The positive state has a positive pulse P. The negative state has a negative pulse P. The zero state has a predetermined stable potential, for example, zero potential.

When the initial two bits of the Manchester code are set, for example, the third bit of the communication data is set as the positive state "1", the initial first bit as the preamble of the communication data may be set to the positive state "1" and the second bit of the communication data may be set to the negative state "−1". When the third bit of the communication data is set to the negative state "−1", the initial first bit of the communication data may be set to the negative state "−1" and the second bit of the communication data may be set to the positive state "1".

The final bit as the postamble of the communication data may have a polarity opposite to the initial first bit of the communication data. Therefore, the number of the positive state "1" and the number of the negative state "−1" can be matched in the communication symbol interval Tp, and the respective potentials of the communication lines 31 to 34 can be balanced.

When the battery monitoring ECU 4 transmits the communication symbol with the initial two bits encoded by the Manchester coding through the transceiver 21, the transceiver 11 of the battery monitoring IC 7 at the reception side detects the initial two bits of the received analog signal encoded by the Manchester coding and detects the state transition of the rising edge or the falling edge of the analog signal.

The communication controller 16 measures the time interval between the state transitions detected in each communication symbol, and acquires it as a reproduced clock having the communication symbol interval Tp as the clock's cycle. The communication controller 16 counts the clock signal of the built-in clock generator 13 between the time intervals at which the measured edge of the reproduced clock is generated. The communication controller 16 compares the measured clock number of the clock generator 13 with the estimated reference clock number stored in the storage 14 to estimate the error in the oscillation frequency of the clock generator 13 in order to correct the oscillation frequency of the clock generator 13. The reproduced clock may also be referred to as a reproduced clock signal.

Therefore, it is possible to correct the discrepancy between the oscillation frequency of the clock signal of the clock generator 24 included in the battery monitoring ECU 4 and the oscillation frequency of the clock signal of the clock generator 13. The communication controller 16 can add an offset to the count value of the counter for correction, or can correct a variety of operation timings based on the clock signal of the clock generator 13.

The present embodiment describes that the oscillation frequency of the clock signal of the clock generator 13 in the battery monitoring device 5a matches to the oscillation frequency of the clock signal of the clock generator 24 of the battery monitoring ECU 4. However, it may also be applied to the battery monitoring devices 5b, 5c such that the oscillation frequency of the clock signal of the clock generator 13 in each of the battery monitoring devices 5b, 5c matches to the oscillation frequency of the clock signal of the clock generator 24 of the battery monitoring ECU 4.

When the battery monitoring ECU 4 transmits the communication symbol adopting the Manchester coding for the initial two bits through the transceiver 21 to the battery monitoring devices 5b, 5c through the communication lines 31 to 33 in a ring connection order, the information of the time interval between the respective edges of two bits in the arrived signal can be transmitted.

The battery monitoring ECU 4 and the battery monitoring devices 5a, 5b, 5c are in ring connection through the communication lines 31 to 34. Therefore, in a case of a general signal, an error accumulates in the arrival time as the signal is transmitted to subsequent stages. However, by transmitting the information of the time interval between the 2-bit state transitions as in the present embodiment, it is possible to set nearly identical time interval between the 2-bit state transitions from the battery monitoring ECU 4 to the battery monitoring device 5a, from the battery monitoring device 5a to the battery monitoring device 5b, and from the battery monitoring device 5b to the battery monitoring device 5c.

In each of the battery monitoring devices 5b and 5c, similarly, the clock signal of the built-in clock generator 13 is counted to compare the time interval between two-bit edges. It is possible to correct the discrepancy of the oscillation frequency of the clock signal by comparing with the reference clock number preliminarily estimated and stored in the storage 14 as similar to the battery monitoring device 5a.

As a result, the oscillation frequency of the clock signal of the clock generator 13 embedded in each of the battery monitoring devices 5a, 5b, 5c can be easily matched to the frequency of the clock signal of the clock generator 24 with a relatively high resolution.

The above describes the correction for the oscillation frequency of the clock signal of the clock generator 13 by measuring the time interval between the falling edges or the rising edges of a signal encoded by the Manchester coding. However, it is not limited to this case. For example, the communication controller 22 of the battery monitoring ECU 4 may transmit two consecutive pulses through the transceiver 11, and the time interval between respective rising edges or respective falling edges of the pulses at each of the battery monitoring devices 5a, 5b, 5c may be counted by the clock signal and is compared with the reference clock number to correct the oscillation frequency of the clock generator 13. Alternatively, the interval of the initial 1-bit in each communication symbol, for example, the time interval between the rising edge and the falling edge, or the interval between the falling edge and the rising edge may be used to correct the oscillation frequency. The oscillation frequency may be corrected by using not only the interval of the initial 1-bit but also the interval of a bit at a specific position.

FIGS. 17 and 18 illustrate modification of the present embodiment. FIGS. 17 and 18 illustrate a situation in which the communication data is "001", and omit other combinations. As long as the number of the positive state "1" and the number of the negative state "−1" are identical, the positive state "1" may be set three times and the negative state "−1" may be set three times.

The 2-bit communication data at the leading end of the communication symbol is required to be set to the negative state "−1" or the positive state "1"; however, the position of the zero state "0" may be set at any position other than the initial two positions. As illustrated in FIG. 17, the zero state "0" may be set at the middle of the communication symbol. Alternatively, as illustrated in FIG. 18, the zero state "0" may be set at the final end of the communication symbol. In other words, the respective polarities of the leading end and the final end may not be in reverse. The leading end may be set to the positive state "1" while the final end may be set to the zero state "0".

OTHER EMBODIMENTS

The present disclosure should not be limited to the embodiments described above, and various modifications may further be implemented without departing from the spirit of the present disclosure. For example, the following modifications or extensions can be performed.

The preceding embodiment describes that the communication symbol has three values respectively being the negative state "−1", the positive state "1", and the zero state "0". However, it is not limited to this case. The negative state is not limited to "−1", but may also be encoded as, for example, the negative state "−2" and the negative state "−3". The amplitude modulation may be executed on the communication analog signal by combining the multiple sets of negative states "−1, "−2, and "−3".

The positive state is not limited to "1", but may also be encoded as, for example, the positive state "2" and the positive state "3". The amplitude modulation may be executed on the analog signal by combining the multiple sets of positive states "1", "2", and "3". At this time, when the communication symbol is formed by making the sum of the numerical values of the communication data to zero, the positive and negative potentials of the communication lines 31 to 34 can be maintained in a well-balanced manner with reference to the zero potential corresponding to the zero state "0". It is also possible to attain the advantageous effect as similar to the preceding embodiment.

The above describes that the communication controller 16 of the battery monitoring IC 7 reads out the values DEMOD_TH1 and DEMOD_TH2 as the communication symbol length Ts from the storage after the power supply is turned on, and sets these values in the register. The values DEMOD_TH1 and DEMOD_TH2 may be instructed to change from the battery monitoring ECU 4 to the battery monitoring devices 5*a*, 5*b*, 5*c*.

For example, the communication controller 22 of the battery monitoring ECU 4 can command to change the bit number of the communication data in the communication symbol by transmitting the command value of each of the values DEMOD_TH1 and DEMOD_TH2. By changing the value DEMOD_TH1, it is possible to change the duration during which the demodulation control signal DEMOD_EN is active, and it is possible to change the communication symbol length Ts which can be received by the reception side. At this time, the communication controller in each of the battery monitoring devices 5*a*, 5*b*, 5*c* transmits an acknowledgment response (ACK) when accepting the change command. Thereby, the number of bits of communication data in the communication symbol can be changed.

The method using the battery monitoring ECU 4 and the battery monitoring devices 5*a*, 5*b*, 5*c* according to the present disclosure may be achieved by a dedicated computer including a processor and a memory programmed to execute one or more functions embodied by a computer program. Alternatively, the battery monitoring ECU 4, the battery monitoring devices 5*a*, 5*b*, 5*c* and the method thereof described in the present disclosure may be implemented by a dedicated computer mainly including a processor configured by one or more dedicated hardware logic circuits.

Alternatively, the battery monitoring ECU 4, the battery monitoring devices 5*a*, 5*b*, 5*c*, and methods thereof described in the present disclosure in the above embodiments may be achieved using one or more dedicated computers constituted by a combination of the processor and the memory programmed to execute one or more functions and the processor with one or more hardware logic circuits. The computer program may be stored, as instructions to be executed by a computer, in a computer-readable non-transitory tangible storage medium.

The present disclosure has been described in accordance with the embodiment described above. However, it is to be understood that the present disclosure is not limited to the embodiment and structure. The present disclosure encompasses various modifications and variations within the scope of equivalents. In addition, various modes/combinations, one or more elements added/subtracted thereto/therefrom, may also be considered as the present disclosure and understood as the technical thought thereof.

What is claimed is:

1. An insulated communication system comprising:
a communication controller configured to
set communication data to a communication symbol through a numeral system being a ternary system or higher, and
execute insulated communication through an insulator by adopting the communication symbol, wherein
the numeral system includes a plurality of states having
a positive state represented by at least one positive integer,
a negative state represented by at least one negative integer, and
a zero state represented by zero, the zero state having a level without generating current consumption in the insulated communication and being between the positive state and the negative state,
an absolute value of the at least one positive integer and an absolute value of the at least one negative integer are identical to each other, and
the communication controller is further configured to:
set an initial section of the communication data in the communication symbol to the positive state or the negative state; and
set a following section of the communication data following the initial section of the communication data to one of the plurality of states,
further comprising:
a storage configured to store a length of the communication symbol communicated in a single modulation,
wherein the communication controller is further configured to receive the communication symbol during a period from a time at which the initial section of the communication data in the communication symbol is received by the communication controller to a time at which the communication controller counts a count number preliminarily set based on the length of the communication symbol stored in the storage.

2. The insulated communication system according to claim 1, wherein the communication controller is further configured to execute communication by encoding initial two bits of the communication data to the communication symbol through Manchester code.

3. An insulated communication system comprising:
a communication controller configured to
set communication data to a communication symbol through a numeral system being a ternary system or higher, and
execute insulated communication through an insulator by adopting the communication symbol, wherein
the numeral system includes a plurality of states having
a positive state represented by at least one positive integer,
a negative state represented by at least one negative integer, and
a zero state represented by zero, the zero state having a level without generating current consumption in the insulated communication and being between the positive state and the negative state,
an absolute value of the at least one positive integer and an absolute value of the at least one negative integer are identical to each other, and
the communication controller is further configured to:
set an initial section of the communication data in the communication symbol to the positive state or the negative state; and set a following section of the communication data following the initial section of the communication data to one of the plurality of states, wherein the insulated communication system is configured to be adapted to a battery monitoring system including a battery monitoring ECU and a plurality of battery monitoring devices, each of the plurality of battery monitoring devices is configured to monitor an assembled battery in which a plurality of battery cells are connected, by acquiring a voltage across one or more of the plurality of battery cells, and each of the battery monitoring ECU and the plurality of battery monitoring devices includes the communication controller, and the communication controller in the battery monitoring ECU and the communication controller in each of the plurality of battery monitoring devices are further configured to execute the insulated communication with a differential signal through the insulator, further comprising:

a storage configured to store a length of the communication symbol communicated in a single modulation, wherein the communication controller included in the battery monitoring ECU is further configured to change the length of the communication symbol, based on a condition that the communication controller included in the battery monitoring ECU transmits a command value and receives an acknowledge response from the communication controller included in each of the plurality of battery monitoring devices.

4. An insulated communication system comprising:

a communication controller configured to set communication data to a communication symbol through a numeral system being a ternary system or higher, and execute insulated communication through an insulator by adopting the communication symbol, wherein the numeral system includes a plurality of states having a positive state represented by at least one positive integer, a negative state represented by at least one negative integer, and a zero state represented by zero, the zero state having a level without generating current consumption in the insulated communication and being between the positive state and the negative state, an absolute value of the at least one positive integer and an absolute value of the at least one negative integer are identical to each other, and the communication controller is further configured to:

set an initial section of the communication data in the communication symbol to the positive state or the negative state;

set a following section of the communication data following the initial section of the communication data to one of the plurality of states; and execute communication by encoding initial two bits of the communication data to the communication symbol through Manchester code.

5. The insulated communication system according to claim 4, wherein the insulated communication system is configured to be adapted to a battery monitoring system including a battery monitoring ECU and a plurality of battery monitoring devices, each of the plurality of battery monitoring devices is configured to monitor an assembled battery in which a plurality of battery cells are connected, by acquiring a voltage across one or more of the plurality of battery cells, and each of the battery monitoring ECU and the plurality of battery monitoring devices includes the communication controller, and the communication controller in the battery monitoring ECU and the communication controller in each of the plurality of battery monitoring devices are further configured to execute the insulated communication with a differential signal through the insulator.

6. The insulated communication system according to claim 4, wherein the communication controller is configured to set the communication data to the communication symbol communicated in a single modulation, such that a sum of the plurality of states in the communication symbol is zero.

7. The insulated communication system according to claim 4, wherein the at least one positive integer includes a plurality of positive integers, the at least one negative integer includes a plurality of negative integers, and the communication controller is further configured to set the communication data to the communication symbol through the plurality of positive integers and the plurality of negative integers, such that a sum of the plurality of positive integers and the plurality of negative integers in the communication symbol is zero.

8. The insulated communication system according to claim 4, further comprising:

a clock generator configured to generate a clock signal, wherein the initial two bits of the communication data are detected based on rising edges or falling edges of a signal modulated by the Manchester code, and the communication controller is further configured to acquire a reproduced clock signal measured between the rising edges or the falling edges of the signal, and compare the clock signal of the clock generator with the reproduced clock signal, in order to correct an oscillation frequency of the clock generator, a count value of a counter acquired by counting a clock of the clock generator, or an operation timing based on the clock signal of the clock generator.

* * * * *